United States Patent
Zanbaghi et al.

(10) Patent No.: US 9,762,257 B2
(45) Date of Patent: Sep. 12, 2017

(54) PHASE SHORTING SWITCH

(71) Applicant: Cirrus Logic International Semiconductor Ltd., Edinburgh (GB)

(72) Inventors: Ramin Zanbaghi, Austin, TX (US); Aaron Brennan, Austin, TX (US); Daniel J. Allen, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/236,163

(22) Filed: Aug. 12, 2016

(65) Prior Publication Data

US 2017/0047939 A1 Feb. 16, 2017

Related U.S. Application Data

(63) Continuation-in-part of application No. 14/826,996, filed on Aug. 14, 2015.

(51) Int. Cl.
*H03M 1/12* (2006.01)
*H03M 1/14* (2006.01)
(Continued)

(52) U.S. Cl.
CPC .............. *H03M 1/14* (2013.01); *G06F 17/11* (2013.01); *H03F 3/005* (2013.01);
(Continued)

(58) Field of Classification Search
CPC .......... H03M 1/14; H03M 3/458; H03M 1/12; G06F 17/11; H04R 2420/05
(Continued)

(56) References Cited

U.S. PATENT DOCUMENTS 6,008,749 A 12/1999 Smith
6,697,006 B1 2/2004 McCartney et al.
(Continued)

FOREIGN PATENT DOCUMENTS

CA 2273658 A1 12/2000
DE 102013015274 A1 3/2015
GB 2502557 A 12/2013

OTHER PUBLICATIONS

Texas Instruments: "PCM186x 11 OdB 2ch and 4ch Audio ADCs with Universal Front End 1 Features 2 Applications Universal Analog Mic Input, 2.1 V RMS Full Scale @Bullet Home Theater and TV @Bullet Automotive Head Units—8 Analog Inputs with MUX and PGA @Bullet Bluetooth Speaker—Analog pre-mix function before PGA/MUX 5B", Aug. 1, 2014 (Aug. 1, 2014), pp. 1-20.

*Primary Examiner* — Jean B Jeanglaude
(74) *Attorney, Agent, or Firm* — Norton Rose Fulbright US LLP

(57) ABSTRACT

An analog-to-digital converter (ADC) may include capability to sense and/or compensate for undesired effects when receiving input from a microphone. For example, a sense node may be provided between differential inputs, and that sense node separated from the differential inputs by two or more switches. The sense node may allow for a measurement of an average voltage of the differential inputs. The average voltage may be obtained activating the switches to sample the sampling capacitors coupled to the differential inputs. That average voltage may be used as common mode (CM) data. A controller may receive the CM data, along with differential mode (DM) data, and use the CM and DM data to determine undesired effects, such as DC or AC mismatch at the microphone interface. The controller may then generate a signal for applying compensation to the differential inputs to reduce or eliminate the undesired effects.

20 Claims, 13 Drawing Sheets

(51) Int. Cl.
| | |
|---|---|
| *H03M 3/00* | (2006.01) |
| *G06F 17/11* | (2006.01) |
| *H04R 3/00* | (2006.01) |
| *H03F 3/45* | (2006.01) |
| *H04R 19/04* | (2006.01) |
| *H03F 3/00* | (2006.01) |
| *G11C 27/02* | (2006.01) |

(52) U.S. Cl.
CPC ..... *H03F 3/45475* (2013.01); *H03F 3/45959* (2013.01); *H03M 1/1295* (2013.01); *H03M 3/458* (2013.01); *H03M 3/496* (2013.01); *H04R 3/00* (2013.01); *H04R 19/04* (2013.01); *G11C 27/024* (2013.01); *H03F 2203/45421* (2013.01); *H03F 2203/45512* (2013.01); *H03F 2203/45544* (2013.01); *H03F 2203/45551* (2013.01); *H03M 1/124* (2013.01); *H04R 2420/05* (2013.01)

(58) Field of Classification Search
USPC .................................. 341/155, 143, 122, 144
See application file for complete search history.

(56) References Cited

U.S. PATENT DOCUMENTS

| | | | |
|---|---|---|---|
| 7,227,957 B2* | 6/2007 | Cheng | H04R 1/00 |
| | | | 181/206 |
| 7,950,281 B2* | 5/2011 | Hammerschmidt | |
| | | | G01C 19/5719 |
| | | | 73/504.04 |
| 8,456,339 B2* | 6/2013 | Zare-Hoseini | H03M 3/32 |
| | | | 341/143 |
| 8,907,703 B1 | 12/2014 | Trampitsch | |
| 2012/0212283 A1 | 8/2012 | Rieger | |
| 2012/0249352 A1* | 10/2012 | Ono | H03M 1/0607 |
| | | | 341/122 |

* cited by examiner

| CONFIGURATION | COUPLING | VCM GEN. | $I_p$ | $D_p$ | $I_n$ | $D_n$ |
|---|---|---|---|---|---|---|
| FD | AC | IN USE | [-32$I_{DAC}$,...,+32$I_{DAC}$] | [XXXXX] | [+32$I_{DAC}$,...,-32$I_{DAC}$] | [XXXXX] |
| FD | DC | NO USE | [-32$I_{DAC}$,...,+32$I_{DAC}$] | [XXXXX] | [+32$I_{DAC}$,...,-32$I_{DAC}$] | [XXXXX] |
| PD | AC | IN USE | [-32$I_{DAC}$,...,+32$I_{DAC}$] | [XXXXX] | 0 | [10000] |
| PD | DC | NO USE | [-32$I_{DAC}$,...,+32$I_{DAC}$] | [XXXXX] | +32$I_{DAC}$ | [11111] |

US 9,762,257 B2

PHASE SHORTING SWITCH

CROSS-REFERENCE TO RELATED PATENT APPLICATIONS

This application is a continuation-in-part of U.S. patent application Ser. No. 14/826,996 to Zanbaghi et al. filed Aug. 14, 2015 and entitled "Dual Processing Paths for Differential Mode and Common Mode Signals for an Adaptable Analog-To-Digital Converter (ADC) Topology," which is hereby incorporated by reference herein.

FIELD OF THE DISCLOSURE

The instant disclosure relates to analog-to-digital converters (ADCs). More specifically, portions of this disclosure relate to adapting ADCs to operate with different input device configurations.

BACKGROUND

Microphones generate electrical signals representative of noises and sounds in the environment around the microphone. Microphones are important devices for many electronic devices because sound, and in particular speech, is one of the most important manners of interaction between a human and an electronic device and a human to another human through an electronic device. Microphones generally produce analog signals, but processors within electronic devices are generally digital components that operate on digital signals. Thus, the analog signals of the microphones must be converted to digital signals for further processing within an electronic device. For example, the analog microphone output may be converted to a digital signal to allow an individual's speech to be transmitted from one cellular phone to another cellular phone. In another example, the analog microphone output may be converted to a digital signal to allow a cellular phone to detect speech commands from a user. The component coupled to the microphone for converting the analog signal to a digital signal is an analog-to-digital converter (ADC).

ADCs are thus important components in electronic devices. One complication with the use of ADCs is that the coupling configuration between the microphone and the ADC changes how the ADC processes the analog output of the microphone to generate a digital representation of the microphone output. That is, an ADC must be matched with the particular microphone coupled to the ADC. This restriction inhibits the ability of a user to use any microphone with their electronic devices. Further, this restriction inhibits the ability of a manufacturer to substitute different microphones due to supply shortages. Some different coupling configurations are shown in FIGS. 1A-1D.

Microphones are either fully-differential (FD) or pseudo-differential (PD) and either AC-coupled or DC-coupled into an analog-to-digital converter (ADC). Thus, there are at least four different microphone topology configurations requiring different operations from and interfaces with an ADC. FIG. 1A illustrates an AC-coupled fully-differential configuration for a microphone and ADC. A microphone 102 may provide outputs 104 and 106. The outputs 104 and 106 are also the inputs to ADC 108, which generates a $D_{out}$ digital signal containing a digital representation of sounds captured by the microphone 102. In AC-coupled configurations, such as FIG. 1A, capacitors 112 and 114 are coupled between the microphone 102 and the ADC 108. The capacitors 112 and 114, along with input impedance of the ADC 108, create a high-pass filter to block DC signals from the microphone 102 from reaching the ADC 108. The capacitors 112 and 114 may be either integrated into a chip along with the ADC 108 or separate from a chip containing the ADC 108. In either case, the capacitors 112 and 114 consume space in an electronic device that increases the dimensions and thickness of the electronic device. Similar to FIG. 1A, FIG. 1B illustrates an AC-coupled pseudo-differential configuration for a microphone and ADC. The pseudo-differential configuration 120 of FIG. 1B is similar to the fully-differential configuration 110 of FIG. 1A, but with one terminal of the microphone 102 grounded to node 116.

Alternatively to the AC-coupled topologies of FIGS. 1A and 1B, DC-coupled topologies may be implemented to interfacing an ADC with a microphone. DC-coupled microphone topologies do not require capacitors 112 and 114 to block the DC value of the microphone outputs. Eliminating the capacitors reduces cost and size, but requires extra processing to make the ADC compatible with fully-differential (FD) and pseudo-differential (PD) microphones. FIG. 1C and FIG. 1D illustrate a DC-coupled fully-differential (FD) configuration 130 and a DC-coupled pseudo-differential (PD) configuration 140, respectively. One example of the extra processing is that a fully-differential (FD) microphone 102 may provide output values of $V_{in}$ and $V_{ip}$, but these values may be mismatched from each other and also from the desired DC value for correct operation of the ADC. Another example of a configuration requiring additional processing is that of a pseudo-differential (PD) microphone in which the $V_{in}$ signal is connected to ground 116. In both of these examples, the ADC 108 must apply processing specific to the microphone configuration of either FIG. 1C or FIG. 1D.

As described above, each of the four configurations of microphone topology shown in FIG. 1A, FIG. 1B, FIG. 1C, and FIG. 1D require different operation and interfacing with an ADC. For example, AC-coupled microphones require a capacitor at the input of the ADC to block DC signals. As another example, AC-coupled microphones require a common mode voltage generator coupled to the ADC to set the DC values of the inputs $V_{in}$ and $V_{ip}$. As yet another example, a DC-coupled fully-differential microphone requires processing by an ADC to match the microphone input signals to a desired DC value. Because of these different requirements, an ADC is conventionally designed to match a specific microphone configuration and is then generally not usable for other microphone configurations.

Further, undesired effects may occur when a microphone is coupled through a differential input to interface with the ADC. For example, the common mode (CM) voltage value of fully-differential inputs may not be matched, such that the common mode at input node 104 is different from the common mode at input node 106. Any mismatch between the input CM values may translate into a differential signal that can clip and saturate components the ADC. As another example, an AC signal amplitude mismatch between the differential inputs may produce similar clipping and saturation in the ADC. FIGS. 1E-1G illustrate examples of these undesired effects. The graphs of FIGS. 1E-1G illustrate differential input signals along with a modulator output when input voltages are matched in FIG. 1E, have mismatched CM voltages in FIG. 1F, and have mismatched DM voltages in FIG. 1G. Both the mismatched CM and mismatched DM examples of FIG. 1F and FIG. 1G, respectively, may result in quantizer saturation or clipping within an ADC, and thus poor ADC performance. In the mismatched CM of FIG. 1F, the modulator output experiences a DC shift 132 approximately equal to half of the input CM mismatch value ($\Delta V_{CM}/2$). In the AC amplitude mismatch of FIG. 1G, there is no offset shift on the output code, but the mismatch causes a gain scaling that may result in a symmetric clipping in the quantizer.

Although undesired effects during fully-differential (FD) operation are described above, undesired effects may also occur during pseudo-differential (PD) operation in which one input is coupled to ground and the other input produces a signal $V_{ip}=V_{cmi}+V_{dm}$. In pseudo-differential (PD) operation, an unbalanced DC shift between differential outputs of components in the ADC may cause swing-driven distortion, such as caused by even harmonics. Such undesired effects also result in poor ADC performance.

Shortcomings mentioned here are only representative and are included simply to highlight that a need exists for improved electrical components, particularly for ADCs employed in consumer-level devices, such as mobile phones. Embodiments described herein address certain shortcomings but not necessarily each and every one described here or known in the art.

SUMMARY

An analog-to-digital converter (ADC) may be configured, in certain embodiments, to automatically determine the microphone configuration and adjust operation to match the determined microphone configuration. Thus, a single ADC device may be used regardless of the configuration of the microphone at the input of the ADC. This ADC configuration may allow a user to not be familiar with the ADC design of an electronic device before selecting a microphone. This ADC configuration may also allow a manufacturer to manufacture an electronic device with one ADC, but still be able to change the microphone configuration during manufacturing. For example, if a supply shortage of AC-coupled fully-differential microphones occurs, then the manufacturer may switch to an AC-coupled pseudo-differential microphone for some production lots without needing to also replace the ADC in the electronic device. This consideration is important as the ADC may be integrated with other components in the electronic device, which means changing microphone configurations during production may result in significant redesign of the electronic device.

One method of processing microphone input in an ADC to determine microphone configuration is to process the microphone input signals in two processing paths, in which one processing path processes a difference between differential input signals and another processing path processes an average value of the differential input signals. The outputs of these processing paths may be combined to generate a digital signal representative of the analog signal from the microphone. The digital signal contains a digital version of the audio in the environment around the microphone, but may also be used to detect microphone topology and configure aspects of the processing paths to match the detected microphone topology. An apparatus for an ADC may implement the two processing paths as two delta-sigma modulator loops. Feedback from the output digital signal may be converted to analog signals in a digital-to-analog converter (DAC). Operation of these DACs may be adjusted by a controller based on the microphone topology.

The improved operation of an analog-to-digital converter (ADC) may be beneficial in, for example, electronic devices including entertainment devices such as audio or video players, smart phones, tablet computers, and personal computers. The ADC may be coupled to any of numerous microphones within these electronic devices. The ADC can detect and adapt to the microphone topology in use within the electronic device. Although this description refers to ADCs used with microphones, the embodiments of ADCs described herein may be coupled to analog devices other than microphones and the ADCs may process that information in a similar manner. That is, the analog-to-digital converters (ADCs) described herein may be coupled to any analog device that provides an analog signal and that analog signal needs to be processed in digital electronics. Further, the ADCs described herein may be used in any electronic device that processes analog signals. For example, although operation of consumer devices, such as cellular phones, may be described, the ADCs may be used in other components, such as audio equipment.

An ADC may include capability to sense and/or compensate for undesired effects, in addition to or without the capability of detecting the microphone interface configuration described above. For example, a sense node may be provided between differential inputs, wherein the sense node is separated from the differential inputs by two or more switches. The sense node may allow for a measurement of an average voltage of the differential inputs. The average voltage may be obtained activating the switches to neutralize charge stored on sampling capacitors coupled to the differential inputs. That average voltage may be used as common mode (CM) data regarding operation of the ADC. A controller may receive the CM data, along with differential mode (DM) data, and use the CM and DM data to determine undesired effects, such as DC or AC mismatch at the microphone interface or the interface between microphone signals and an analog-to-digital converter (ADC). The controller may then generate a signal for applying compensation to the differential inputs, such as through an auxiliary digital-to-analog converter (DAC), to reduce or eliminate the undesired effects.

According to one embodiment, an analog-to-digital converter (ADC) for converting an input analog signal to an output digital signal may include a first input node for receiving a first input of a differential signal representing the input analog signal; a second input node for receiving a second input of the differential signal representing the input analog signal; a common mode input node for receiving a reference common mode signal; a first processing path coupled to the first input node and coupled to the second input node, wherein the first processing path is configured to output at a first processing output node a first digital signal indicative of the received differential signal; a second processing path coupled to the first input node, coupled to the second input node, and coupled to the common mode input node, wherein the second processing path is configured to output at a second processing output node a second digital signal indicative of a comparison between an average value of the received differential signal and the reference common mode signal; a combiner module coupled to the first processing output node of the first processing path and the second processing output node of the second processing path, wherein the combiner module is configured to generate the output digital signal based, at least in part, on the first digital signal and the second digital signal.

In certain embodiments, the analog-to-digital converter (ADC) may also include a controller, in which the controller is configured to receive the output digital signal, determine a coupling configuration of an input device coupled to the first input node and the second input node based, at least in part, on the received output digital signal, and adjust operation of the analog-to-digital converter (ADC) based, at least in part, on the determined coupling configuration; a first digital output data node coupled to the combiner module; may also include a second digital output data node coupled to the combiner module, wherein output at the first digital output data node and the second digital output data node are a representation of the output digital signal; may also include a first digital-to-analog converter (DAC) coupled to the first digital output data node and coupled to at least a first input of the first processing path; and/or may also include a second digital-to-analog converter (DAC) coupled to the second digital output data node and coupled to at least a second input of the first processing path, wherein the controller is coupled to the first DAC and to the second DAC and further configured to adjust operation of the analog-to-digital converter (ADC) by performing steps comprising operating the first DAC and the second DAC based, at least in part, on the received digital output data.

In certain embodiments, the controller may determine the coupling configuration to be one of AC-coupled fully-differential, AC-coupled pseudo-differential, DC-coupled fully-differential, and DC-coupled pseudo-differential; the combiner module may be configured to output the output digital signal as at the first digital output data node and the second digital output data node; the combiner module may output, at the first digital output data node, a first digital signal based, at least in part, on a summation of an output of the first processing path and an output of the second processing path; the combiner may output, at the second digital output data node, a second digital signal based, at least in part, on a difference between the output of the first processing path and the output of the second processing path; the first processing path may include a first delta-sigma modulator loop; the second processing path may include a second delta-sigma modulator, and/or the first input node and the second input node may be configured to couple to a microphone with a differential output.

According to another embodiment, a method may include receiving, by an analog-to-digital converter (ADC), a first input of an analog differential signal; receiving, by the analog-to-digital converter (ADC), a second input of the analog differential signal; processing, by the analog-to-digital converter (ADC), a difference between the first input and the second input in a first processing loop; processing, by the analog-to-digital converter (ADC), an average of the first input and the second input in a second processing loop; and/or combining, by the analog-to-digital converter (ADC), the processed difference of the first processing loop and the processed average of the second processing loop to produce a digital signal indicative of the analog differential signal.

In some embodiments, the method may further include determining, by a controller, a coupling configuration of an input device generating the first input and the second input to the analog-to-digital converter (ADC); may further include adjusting, by the controller, operation of the analog-to-digital converter (ADC) based, at least in part, on the determined coupling configuration; may further include converting a first digital output of the combined digital signal to a first analog feedback signal; may further include providing the first analog feedback signal to the first processing loop; may further include converting a second digital output of the combined digital signal to a second analog feedback signal; and/or may further include providing the second analog feedback signal to an input of the first processing loop different from an input of the first processing loop coupled to the first analog feedback signal.

In certain embodiments, the step of determining the coupling configuration may include at least one of determining the coupling configuration of the input device is AC-coupled fully-differential, determining the coupling configuration of the input device is AC-coupled pseudo-differential, determining the coupling configuration of the input device is DC-coupled fully-differential, and determining the coupling configuration of the input device is DC-coupled pseudo-differential; the step of combining to generate the digital signal may include outputting a first digital signal based, at least in part, on a summation of an output of the first processing path and an output of the second processing path, and/or outputting a second digital signal based, at least in part, on a difference between the output of the first processing path and the output of the second processing path; the step of processing in the first processing loop may include processing in a first delta-sigma modulator loop; the step of processing the second processing loop may include processing in a second delta-sigma modulator loop; and/or the steps of receiving the first input and receiving the second input may include receiving inputs from a microphone with a differential output.

According to another embodiment, an apparatus may include a first input node for receiving a first input of an analog differential signal; a second input node for receiving a second input of the analog differential signal; a digital output node; an analog-to-digital converter (ADC) configured to convert the analog differential signal, which may be a pseudo-differential signal, into a digital signal at the digital output node; and/or a controller coupled to the analog-to-digital converter. The analog-to-digital converter (ADC) may include a first processing loop configured to process a difference between the first input and the second input; a second processing loop configured to process an average of the first input and the second input; and/or a combiner module configured to receive an output of the first processing loop, to receive an output of the second processing loop, and to generate the digital signal based, at least in part, on an output of the first processing loop and an output of the second processing loop. The controller may be configured to determine a coupling configuration of an input device generating the first input and the second input to the analog-to-digital converter (ADC), wherein the determined configuration is based, at least in part, on the digital signal; and/or configured to adjust operation of the analog-to-digital converter (ADC) based, at least in part, on the determined coupling configuration.

In certain embodiments, the combiner may be configured to output a pseudo-differential digital signal comprising a first component and a second component, wherein the first component comprises digital data indicative of a summation of an output of the first processing path and an output of the second processing path, and wherein the second component comprises digital data indicative of a difference between the output of the first processing path and the output of the second processing path; the first processing path may include a first delta-sigma modulator loop; the second processing path may include a second delta-sigma modulator; the first input node and the second input node may be a microphone input node; and/or the apparatus may be at least one of an entertainment device, a smart phone, a tablet computer, and a personal computer.

According to a further embodiment, a method for compensating common mode and differential mode mismatches for an analog-to-digital converter (ADC) may include receiving digital common mode (CM) data and differential mode (DM) data and/or generating a control signal for output to a digital-to-analog converter (DAC) such that the digital-to-analog converter (DAC) provides compensation in the analog-to-digital converter (ADC) for least one of common mode and differential mode mismatches.

In certain embodiments, the step of receiving the common mode (CM) data may include receiving a DC average voltage level and/or an AC voltage level between differential input nodes of the analog-to-digital converter (ADC), wherein the DC average voltage level is received from a common mode (CM) sense node coupled to the differential input nodes by switches; the method may also include the step of activating the switches to obtain an average voltage value in sampling capacitors coupled to the differential input nodes; the step of receiving the differential mode (DM) data may include receiving a difference between differential input nodes, wherein the difference is received from a quantizer of the analog-to-digital converter (ADC); and/or the step of generating the control signal comprises the steps of determining a configuration of a microphone coupled to differential input nodes of the analog-to-digital converter (ADC) and/or determining common mode and differential mode mismatches in the analog-to-digital converter (ADC), wherein the step of generating the control signal comprises generating the control signal based, at least in part, on the determined configuration of the microphone and the determined common mode and differential mode mismatches.

According to another embodiment, an apparatus may include a controller configured to operate an analog-to-digital converter (ADC) by performing steps including the method for compensating common mode and differential mode mismatches described above.

According to a further embodiment, a method for sensing an average of differential input voltages at two input nodes in a common-mode switched capacitor system may include providing differential inputs to the switched capacitor system, wherein at least two sampling capacitors are coupled to each of the two input nodes; and/or the method may include operating two or more switches to obtain an average voltage of the differential inputs at a sampling node. The method may also include converting an analog value of the average voltage to a digital value for feedback to a controller of the switched capacitor system and/or compensating for undesired effects at the differential inputs based, at least in part, on the average voltage generated at the output node.

According to another embodiment, an apparatus may include a differential input including a first input node and a second input node; at least two sampling capacitors including a first capacitor coupled to the first input node and a second capacitor coupled to the second input node; at least two switches including a first switch coupled to the first capacitor and a second switch coupled to the second capacitor and coupled to the first switch; and/or a controller coupled to the at least two switches, wherein the controller is configured to perform steps including operating the at least two switches to obtain an average voltage of the differential inputs at an output node between the first switch and the second switch. In some embodiments, the apparatus may also include an analog-to-digital converter (ADC) coupled to the output node and coupled to the controller, wherein the ADC is configured to provide common mode (CM) data to the controller based on the average voltage and/or the apparatus may include an analog-to-digital converter (ADC), wherein the controller is further configured to operate the ADC to compensate for mismatch at the differential input based, at least in part, on the average voltage generated at the output node.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
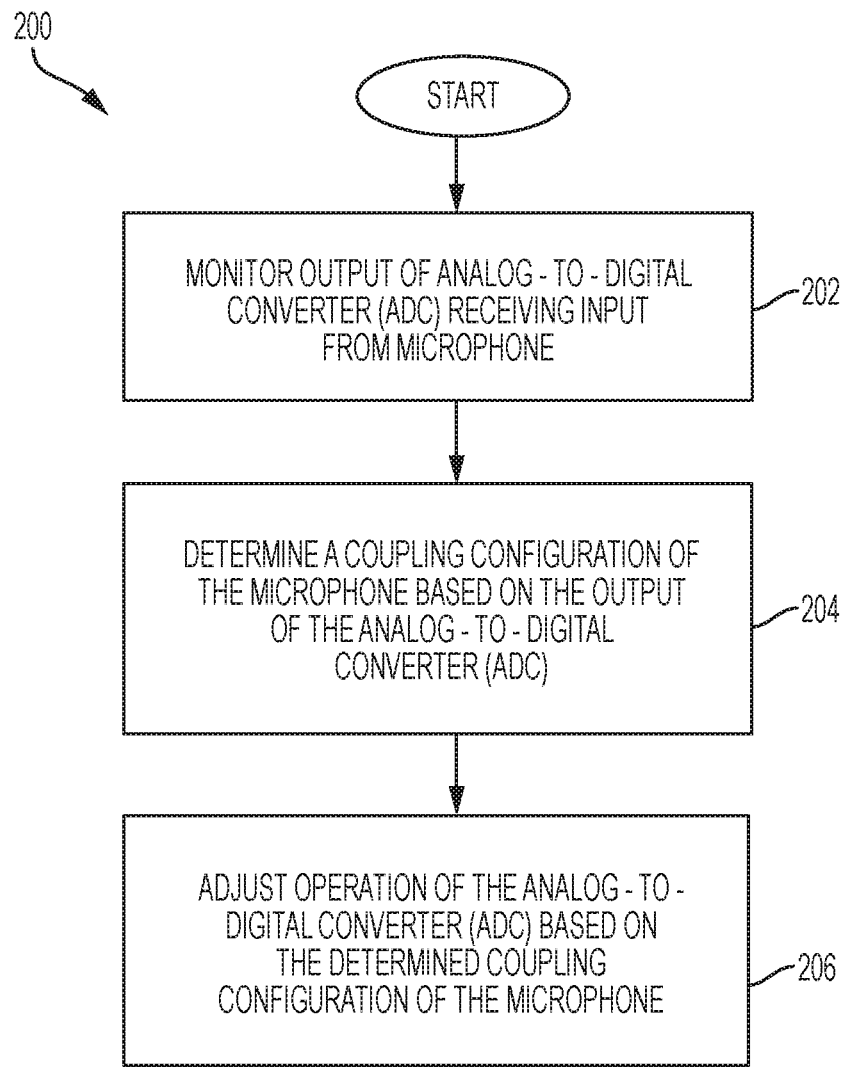
FIG. 2 is a flow chart illustrating a method of detecting and adjusting operation of an analog-to-digital converter (ADC) to match a microphone topology according to one embodiment of the disclosure.

FIG. 2 is a flow chart illustrating a method of detecting and adjusting operation of an analog-to-digital converter (ADC) to match a microphone topology according to one embodiment of the disclosure. A method 200 begins at block 202 with monitoring an output of an analog-to-digital converter (ADC) that is receiving analog input from a microphone. The monitored output may be, for example, a digital output or a pseudo-digital output from the ADC. Then, at block 204, a coupling configuration of the microphone may be determined based on the monitored output of the ADC at block 202. The determination may be made based on instantaneous values at the ADC output or the determination may be made by evaluating the ADC output over a certain period of time. Next, at block 206, the operation of the analog-to-digital converter (ADC) may be adjusted based on the determined coupling configuration of the microphone. The method 200 may be performed by a controller coupled to the analog-to-digital converter or a controller integrated with the analog-to-digital converter.

Figure 3:
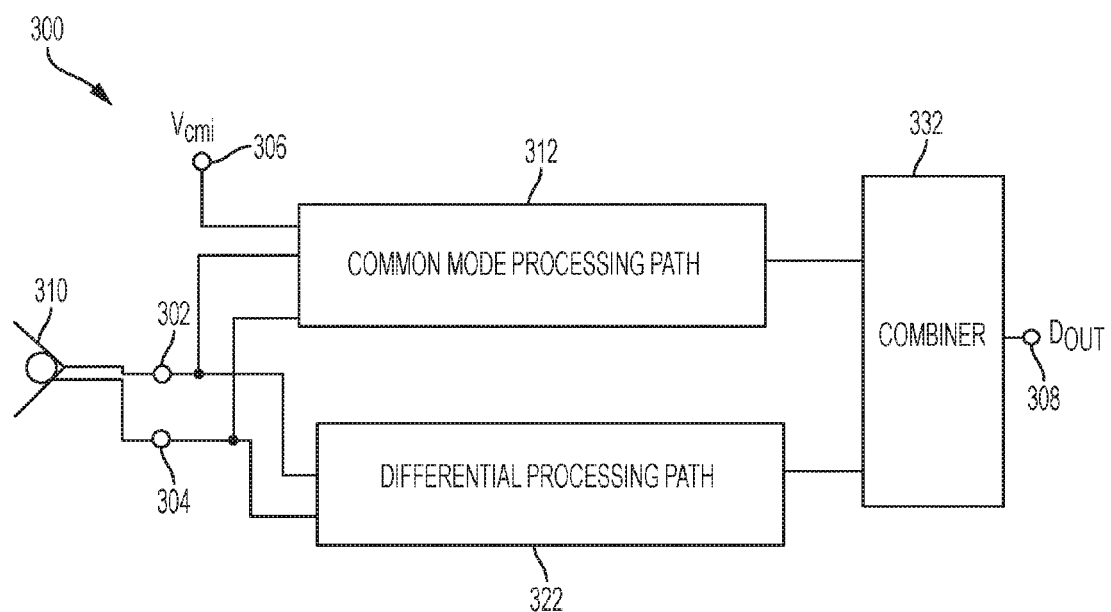
FIG. 3 is a block diagram illustrating a portion of an analog-to-digital converter (ADC) with two processing paths for processing analog signals according to one embodiment of the disclosure.

One method of processing the analog signal from a microphone in an ADC to determine microphone configuration as described in FIG. 2 is to process the microphone input signals in two processing paths. A first processing path may process a difference between differential input signals, and a second processing path may process an average value of the differential input signals. FIG. 3 is a block diagram illustrating a portion of an analog-to-digital converter (ADC) with two processing paths for processing analog signals according to one embodiment of the disclosure. An analog-to-digital converter (ADC) 300 may include a first input node 302 and a second input node 304. The input nodes 302 and 304 may be configured to couple to a microphone 310 to receive, as a differential or pseudo-differential input, an analog signal generated by the microphone 310 indicative of sounds in an environment around the microphone 310. Although only portions of the ADC 300 are illustrated in FIG. 3, such as loop filter components, additional components not shown in FIG. 3 may be present in an ADC.

The ADC 300 may process the input received at input nodes 302 and 304 to generate digital output $D_{out}$ at output node 308. Processing may occur through two processing paths 312 and 322. A differential processing path 322 may process a difference between the differential signal at input nodes 302 and 304. A common mode processing path 312 may process an average value of the differential inputs at input nodes 302 and 304. In one embodiment, the common mode processing path 312 may generate a difference between the average value of the differential inputs and an ideal common mode voltage $V_{CMI}$ received at an input node 306. Outputs of the processing paths 312 and 322 may be provided to combiner 332, which generates at least one digital output signal $D_{out}$ at output node 308.

Figure 4:
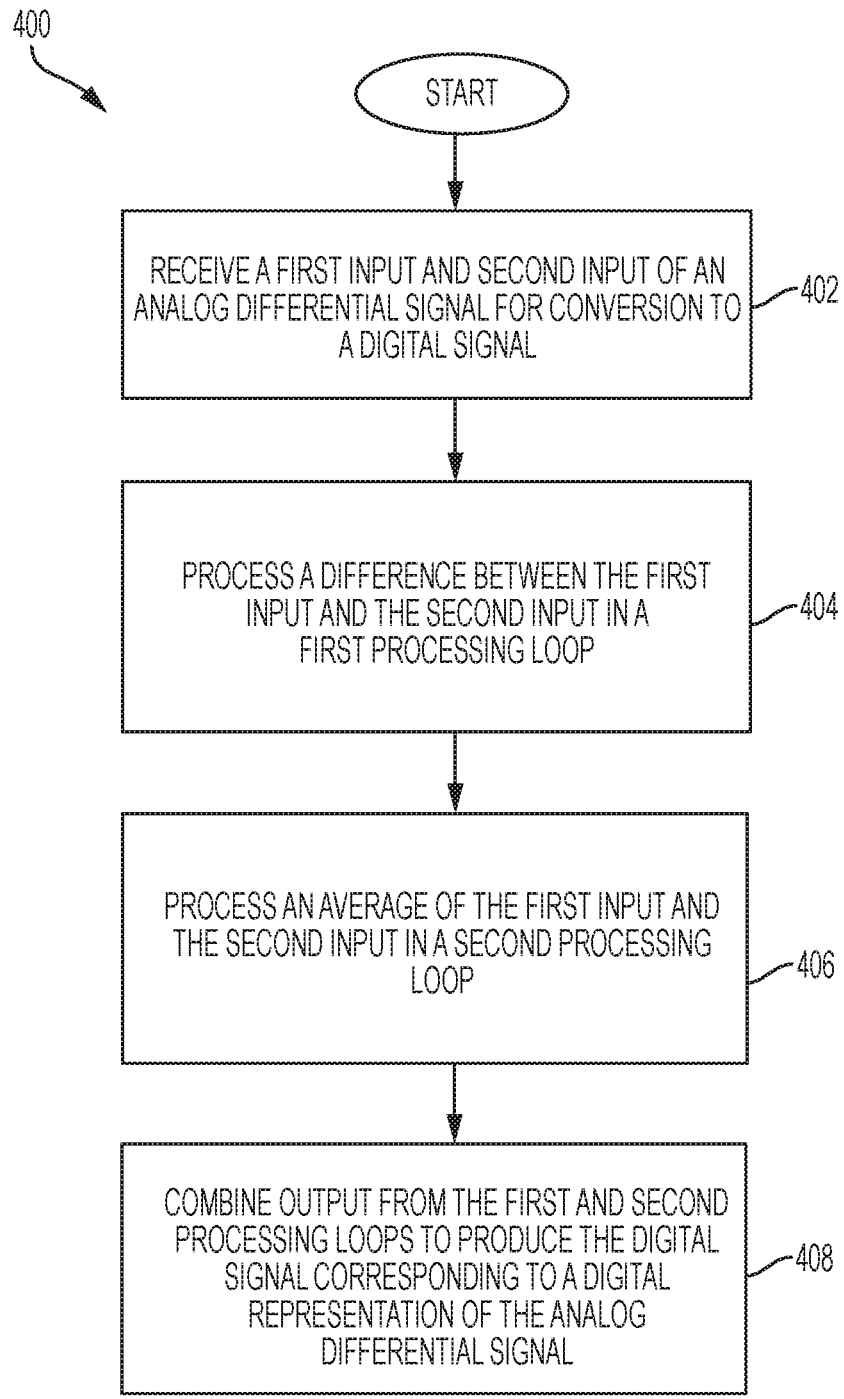
FIG. 4 is a flow chart illustrating a method of converting analog signals to digital signals in an analog-to-digital converter (ADC) with two processing paths according to one embodiment of the disclosure.

A method for processing an analog differential signal through an ADC configured with two processing paths as illustrated in FIG. 3 is described with reference to FIG. 4. FIG. 4 is a flow chart illustrating a method of converting analog signals to digital signals in an analog-to-digital converter (ADC) with two processing paths according to one embodiment of the disclosure. A method 400 begins at block 402 with receiving a first input and a second input of an analog differential signal for conversion to a digital signal. Then, at block 404, a difference between the first input and the second input is processed in a first processing loop, such as the differential processing path 322 of FIG. 3. Next, at block 406, an average of the first input and the second input is processed in a second processing path, such as in common mode processing path 312 of FIG. 3. The processing of blocks 404 and 406 may occur simultaneously. In other embodiments, the processing of blocks 404 and 406 may occur in serial fashion for individual samples taken from the first input and the second input. Then, at block 408, the output of the difference processing of block 404 and the average processing of block 406 may be combined, such as in combiner 332 of FIG. 3, to produce the digital signal. The digital signal produced by combining the outputs of the processing paths corresponds to a digital representation of the analog differential signal. When a microphone is coupled to the first input and the second input, this digital signal is a digital representation of sounds in an environment around the microphone.

Figure 5:
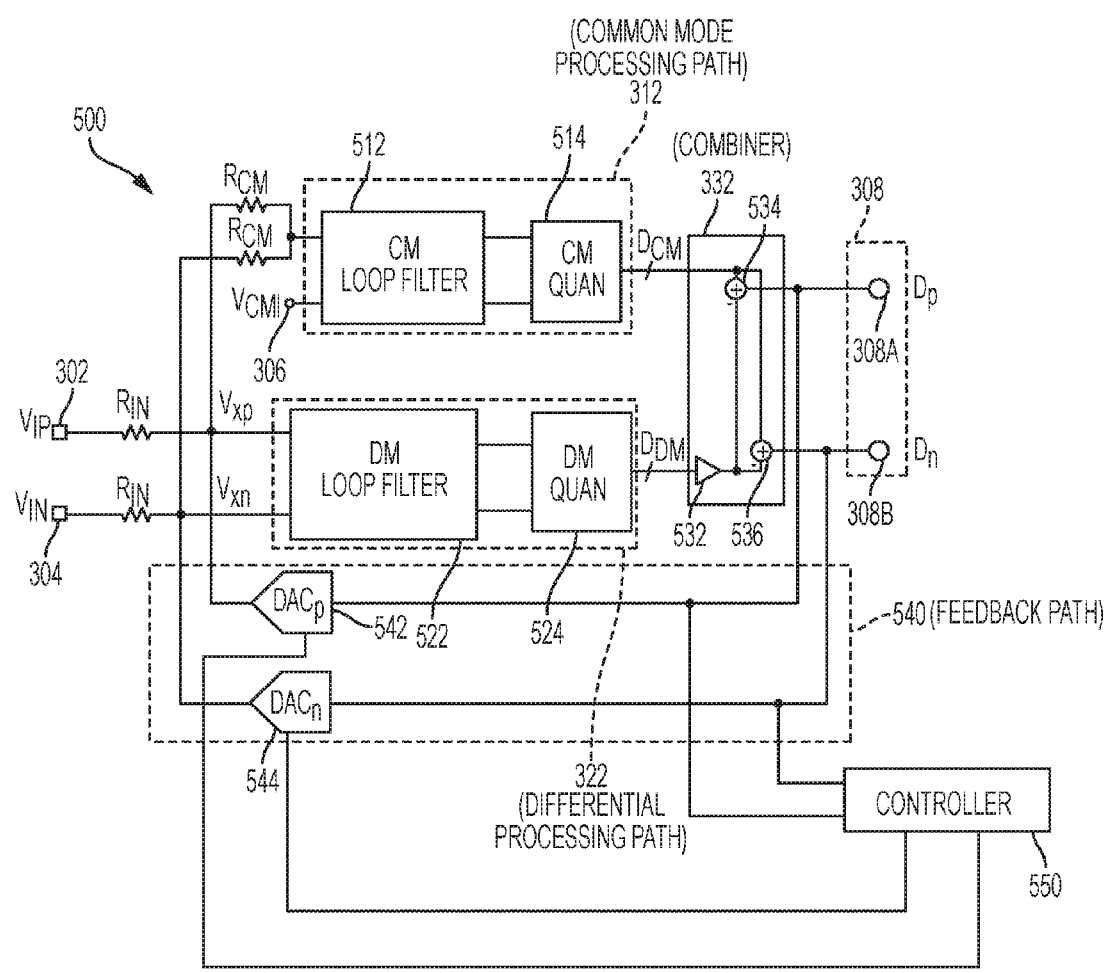
FIG. 5 is a circuit schematic illustrating a portion of an analog-to-digital converter with two processing paths according to one embodiment of the disclosure.

One embodiment for implementing an analog-to-digital converter (ADC) with two processing paths implements the two processing paths as delta-sigma modulators as shown in FIG. 5. FIG. 5 is a circuit schematic illustrating a portion of an analog-to-digital converter with two processing paths according to one embodiment of the disclosure. An analog-to-digital converter (ADC) 500 supports a universal microphone topology, which supports microphone topologies such as AC-coupled, DC-coupled, fully-differential, and pseudo-differential microphones. The first processing path 322 and the second processing path 312 include loop filters 522 and 512 and quantizers 524 and 514, respectively. The processing paths 312 and 322 output to combiner 332, which generates a pseudo-digital signal at output nodes 308A and 308B. The pseudo-digital signal at nodes 308A and 308B are provided through a feedback path 540 to inputs of the processing paths 312 and 322, respectively. The feedback path 540 includes digital-to-analog converters (DACs) 542 and 544. Outputs of the DACs 542 and 544 may be coupled to first and second inputs of the differential processing path 322, respectively. Further, the output of the DACs 542 and 544 may be averaged for input to the common mode processing path 312. Each of the processing paths 312 and 322 thus is a functional ADC loop coupled to the same front-end and back-end. However, each of the processing paths 312 and 322 processes different aspects of the input signal received at input nodes 302 and 304.

The input nodes 302 and 304 couple a differential signal to two front-end summing nodes $V_{xn}$, $V_{xp}$ and into the differential-mode (DM) loop filter 522. The input nodes 302 and 304 also couple an average of the differential signal to the common-mode (CM) loop filter 512. The common mode loop filter also receives an ideal CM voltage $V_{CMI}$ from input node 306, which may indicate a desired common mode voltage selected to match a desired input at amplifiers (not shown) within the loop filters 512 and 522. Thus, a differential error signal passes through the DM loop filter 522, and a common-mode error signal passes through the CM loop filter 512. The loop filters 512 and 522 may include, for example, integrators that contain operational amplifiers. Those operational amplifiers may be designed to operate in certain ranges that match the ideal common mode voltage $V_{CMI}$ received at node 306. The output of the loop filters 512 and 522 are quantized in quantizers 514 and 524, respectively, to generate digital outputs $D_{CM}$ and $D_{DM}$. The $D_{CM}$ digital output may contain a digital representation of an error signal based on comparing the average value of the inputs with the ideal common mode voltage $V_{CMI}$; the $D_{DM}$ digital output may contain a digital representation of an error signal based on the differential input at input nodes 302 and 304. After quantization, the CM and DM digital outputs, $D_{CM}$ and $D_{DM}$, are combined at combiner 332, such as by using a decoder to generate pseudo digital data, which carries CM and DM information. The pseudo-digital data may be output as $D_p$ and $D_n$ signals at nodes 308A and 308B, in which $D_p$ contains $(D_{CM}+D_{DM}/2)$ information, and $D_n$ contains $(D_{CM}-D_{DM}/2)$ information. The combiner may include an amplifier 532 and summation blocks 534 and 536 to generate the output $D_p$ and $D_n$ signals from the output of paths 312 and 322.

Figures 6, 7:
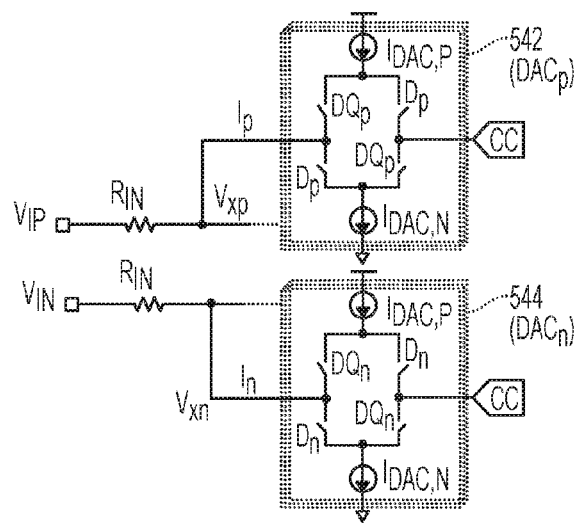
FIG. 6 is a circuit schematic illustrating digital-to-analog converters (DACs) from the feedback path of the analog-to-digital converter (ADC) according to one embodiment of the disclosure.
FIG. 7 is a table showing example outputs from a 5-bit analog-to-digital converter (ADC) configured according to one embodiment of the disclosure.

The pseudo-digital data $(D_n, D_p)$ may be coupled to DACs 544 and 542, respectively, in feedback path 540. In one embodiment, the DACs 544 and 542 may be implemented as current-steering DACs. FIG. 6 is a circuit schematic illustrating digital-to-analog converters (DACs) from the feedback path of the analog-to-digital converter (ADC) according to one embodiment of the disclosure. In the DACs 542 and 544, the pseudo-digital output $D_p$ controls the switches of the current DAC in $DAC_p$ 542 and $D_n$ controls the switches of $DAC_n$ 544.

Operation of the ADC 500 of FIG. 5 may be explained with reference to FIG. 7, which is a table showing example outputs of the ADC 500 when configured as a 5-bit ADC. For the AC-coupled fully-differential microphone topology, the DC values of $V_{in}$ and $V_{ip}$ may be set to $V_{CMI}$ internally and the CM error may be zero. As a result, DAC 542 output value $I_p$ may sweep from $-32*I_{DAC}$ to $+32*I_{DAC}$, and DAC 544 output value $I_n$ may sweep from $+32*I_{DAC}$ to $-32*I_{DAC}$ resulting in an opposite code on $D_n$ and $D_p$. For the DC-coupled fully-differential topology, if the DC value of the inputs at nodes 302 and 304 is matched with $V_{CMI}$ at node 306, there will not be any common-mode error signal, and the output will be similar to that of the AC-coupled FD case. For the DC-coupled fully-differential topology, if the DC value of the inputs at nodes 304 and 304 is not matched with $V_{CMI}$ at node 306 (such that there is a CM error), then the CM loop filter 512 may adjust $I_p$ and $I_n$ values to offset that CM error. Then, the output again will be similar to that of the AC-coupled FD case. Thus, if a controller, such as controller 550 of FIG. 5, detects an average of $D_n$ and $D_p$ digital output codes is zero, then the controller may determine that the microphone topology is fully-differential. The controller may further discriminate between the AC-coupled and DC-coupled variations of the fully-differential topology by receiving additional information. For example, the controller may receive a programmed signal from a memory or a fuse. In another example, the controller may determine an amount of current drawn from the $V_{CMI}$ input node 306.

For the AC-coupled pseudo-differential topology, DC values of $V_{ip}$ and $V_{in}$ may be set internally to match $V_{CMI}$ received at input node 306. Then, the $D_p$ and $I_p$ values may be similar to that of the AC-coupled FD case, but different in that the $I_n$ value will be zero ($D_n$=[10000], which is the mid code), because there is no AC signal at node 304 for $V_{in}$ and its DC value is set by a $V_{cm}$ generator block (not shown). Thus, if a controller, such as controller 550 of FIG. 5, detects a $D_n$ value of [10000], then the controller may determine that the microphone topology is AC-coupled pseudo-differential.

For the DC-coupled pseudo-differential topology, $D_p$ and $I_p$ values will be similar to that for the AC-coupled pseudo-differential topology (assuming the DC value on $V_{ip}$ matches $V_{CMI}$), but $I_p$ will max out at $+32*I_{DAC}$ to set the DC value of the $V_{xn}$ node, resulting in an output value $D_n$=[11111]. Thus, if a controller, such as controller 550 of FIG. 5, detects a $D_n$ value of [11111], then the controller may determine that the microphone topology is DC-coupled pseudo-differential topology.

A controller may use a digital detection algorithm to detect the microphone topology by monitoring the data pattern on $D_p$ and $D_n$ and based on that distinguish the various topologies. In some embodiments, additional information may be provided to the controller to assist in the determination. After determining the microphone topology, the controller may adjust operation of the ADC based on the determined topology. For example, when the topology is pseudo-differential AC-coupled, the controller 550 may shut down DAC 544. Alternatively, a few units of the DAC 544 may remain switched on for determining mismatches. As another example, when the topology is pseudo-differential DC-coupled, the controller may shut down NMOS side current of DAC 544 to reduce power consumption. In some embodiments, the controller may wait to adjust operation of the DAC until a stable condition is achieved within the ADC. The stable condition may be reached after a certain amount of time has elapsed from start-up of the ADC or a signal first appearing at the input of the ADC. Alternatively, the stable condition may be reached when the output of the DAC reaches an expected signal. The controller 550 described herein may be integrated with the DAC or external to the DAC.

Figure 1A:
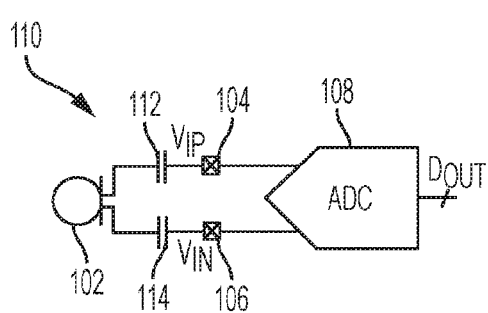
FIG. 1A is a block diagram illustrating a microphone coupled to an analog-to-digital converter (ADC) in a fully-differential AC-coupled configuration.
Figure 1B:
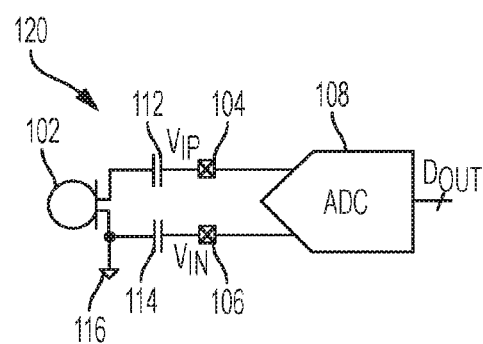
FIG. 1B is a block diagram illustrating a microphone coupled to an analog-to-digital converter (ADC) in a pseudo-differential AC-coupled configuration.
Figure 1C:
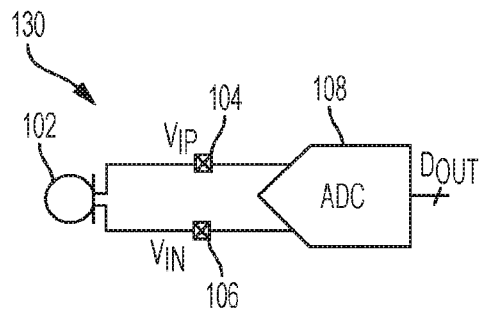
FIG. 1C is a block diagram illustrating a microphone coupled to an analog-to-digital converter (ADC) in a fully-differential DC-coupled configuration.
Figure 1D:
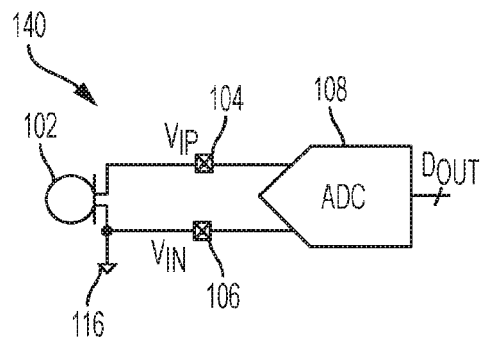
FIG. 1D is a block diagram illustrating a microphone coupled to an analog-to-digital converter (ADC) in a pseudo-differential DC-coupled configuration.
Figure 1E:
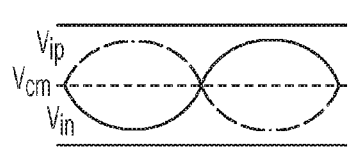
FIG. 1E is a graph illustrating a modulator digital output code in an analog-to-digital converter (ADC).
Figure 1E:
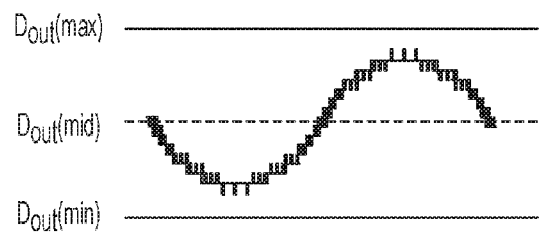
Figure 1F:
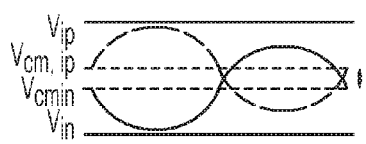
FIG. 1F is a graph illustrating a modulator digital output code in an analog-to-digital converter (ADC) with fully-differential inputs having mismatched common mode (CM) values.
Figure 1F:
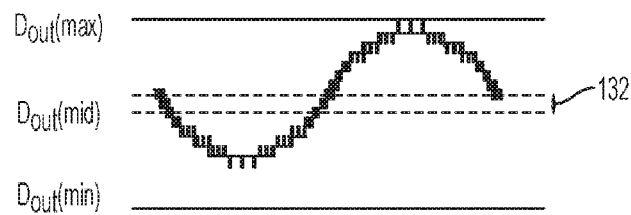
Figure 1G:
FIG. 1G is a graph illustrating a modulator digital output code in an analog-to-digital converter (ADC) with fully-differential inputs having mismatched differential mode (DM) values.
Figure 1G:
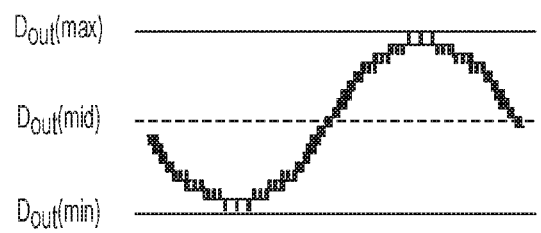
Figure 8:
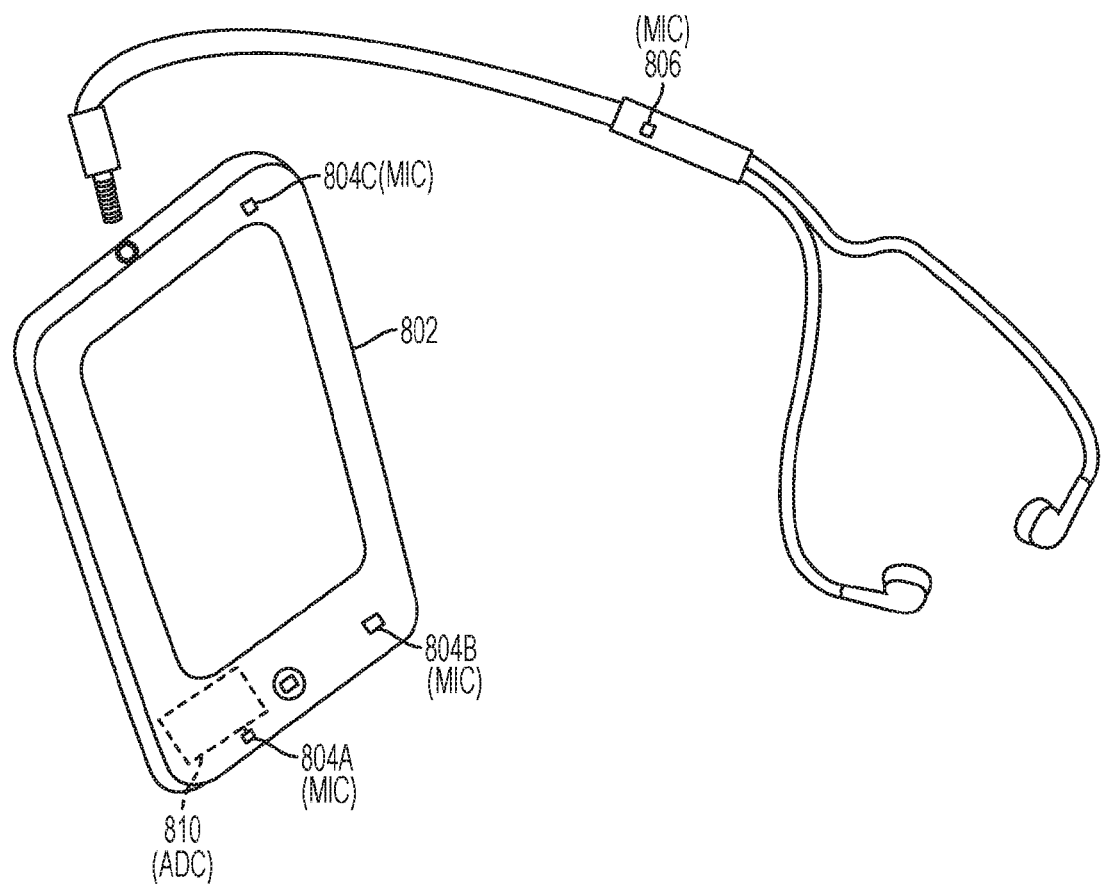
FIG. 8 is an illustration showing an electronic device with an analog-to-digital converter (ADC) capable of operating microphones of different topologies according to one embodiment of the disclosure.

The DAC configurations described above as a universal and/or adaptive DAC for various microphone topologies may be implemented in an electronic device having microphones (or other analog input devices interacting with digital components). FIG. 8 is an illustration showing an electronic device with an analog-to-digital converter (ADC) capable of operating microphones of different topologies according to one embodiment of the disclosure. A mobile device 802 may be, for example, a cellular telephone. Mobile devices 802 may include multiple microphones, such as speech microphones 804A and 804B, proximity microphone 804C for noise cancelling, and/or headset microphone 806. Microphones may be either integrated with the electronic device 802, such as microphones 804A, 804B, and 804C, or may be external to the electronic device 802, such as with microphone 806. An ADC 810 of the electronic device 802 may be coupled to the microphones 804A, 804B, 804C, and/or 806 to process input signals from the microphones 804A, 804B, 804C, and/or 806. The ADC 810 may incorporate two processing loops, such as described with reference to FIG. 3, FIG. 4, FIG. 5, and FIG. 6. The ADC 810 may also incorporate monitoring and adjustment capabilities described with reference to FIG. 2 and FIG. 7. The universal nature of the ADC 810 in supporting different topologies benefits end users in that the end user does not need to be aware of the microphone topology and benefits manufacturers in that the manufacture may switch microphone suppliers during production of an electronic device without also needing to change the ADC 810. Further, when the microphone is an AC-coupled topology, the interface between the ADC 810 and the microphone does not require coupling capacitors, such as capacitors 112 and 114 of FIG. 1A and FIG. 1B. Thus, the use of an ADC as disclosed herein can reduce space occupied by the microphone and ADC interface in an electronic device. Additional embodiments of an ADC or portions of an ADC that may be implemented in an electronic device, such as mobile device 802, are described below.

Figure 9:
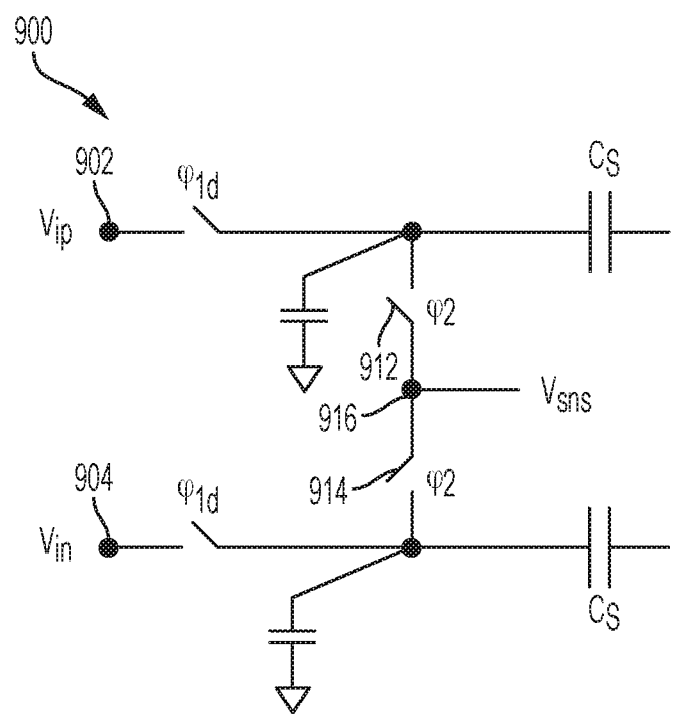
FIG. 9 is a circuit schematic illustrating front-end switches for an analog-to-digital converter (ADC) with shoring phase switches configured to provide a sense node according to one embodiment of the disclosure.

FIG. 5 illustrates, and the description referencing FIG. 5 describes, use of a feedback path 540 under operation by the controller 550 to apply signals to the differential nodes at $V_{xp}$ and $V_{xn}$, which are coupled to differential input nodes 302 and 304. In some embodiments, digital-to-analog converters (DACs) of the feedback path 540 may be used as an auxiliary digital-to-analog converter (DAC) to provide compensation for common mode and differential mode mismatches. In some of these embodiments, the auxiliary DACs may be controlled based on a measurement from a common mode (CM) sense node. A CM sense node may be provided through two or more switches coupled between the differential inputs. One such embodiment is shown in FIG. 9 using shorting phase switches. FIG. 9 is a circuit schematic illustrating front-end switches for an analog-to-digital converter (ADC) with shorting phase switches configured to provide a sense node according to one embodiment of the disclosure. A circuit 900 includes two shorting switches 912 and 914, which may be operated, such as by a controller (not yet shown), to short two input sampling caps during a second clock phase of operation. A sense node 916 between the two shorting switches 912 and 914 may provide a common mode (CM) sense node.

In particular, a voltage at the sense node 916 may provide data regarding an average voltage between the input nodes 902 and 904 during certain times of operation of the circuit 900. The shorting switches 912 and 914, along with any parasitic capacitance (not shown) between the switches 912 and 914, creates a switched-capacitor (SC) resistor. The SC resistor may have a large resistance value because the value is inversely proportional to the small parasitic cap value. The embodiment of FIG. 9 uses switches to create two large resistors for providing the CM sense node. When the switches 912 and 914 are made conductive, the middle node 916 stabilizes to a voltage level that is approximately the average of the input voltage at input nodes 902 and 904.

Figure 10:
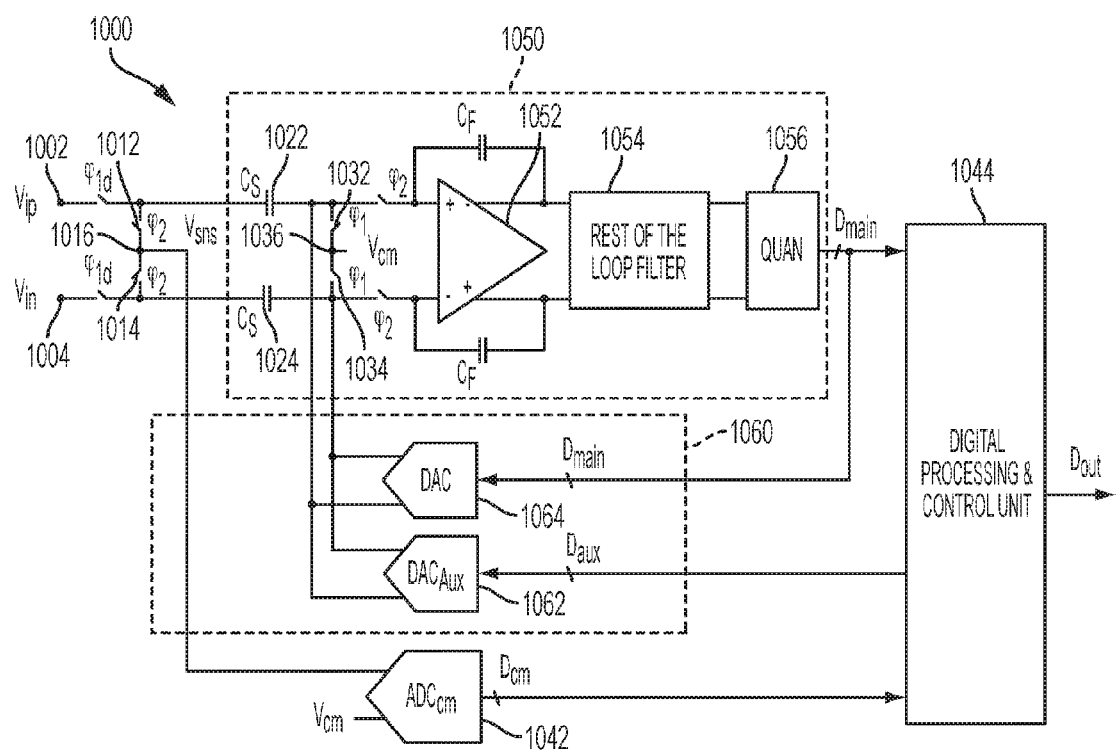
FIG. 10 is a circuit schematic illustrating interface detection and compensation for an analog-to-digital converter (ADC) according to one embodiment of the disclosure.

Input from the sense node 916 may be provided to a controller to operate DACs in a feedback path of an ADC. One embodiment of an ADC implementing feedback based on a CM sense node along with interface detection hardware similar to that described with reference to FIG. 3 or FIG. 5 is shown in FIG. 10. FIG. 10 is a circuit schematic illustrating interface detection and compensation for an analog-to-digital converter (ADC) according to one embodiment of the disclosure. Although a particular ADC configuration is shown in FIG. 10, the sense node and/or controller described herein may be implemented in other ADC configurations, including switched-capacitor ADC circuits and continuous-time ADC circuits.

An analog-to-digital converter (ADC) circuit 1000 includes a first set of shorting switches 1012 and 1014 coupled on a first side of sampling capacitors 1022 and 1024, respectively. The shorting switches 1012 and 1014 couple differential input nodes 1002 and 1004 to a sense node 1016. The circuit 1000 also includes a second set of shorting switches 1032 and 1034 coupled on a second side of sampling capacitors 1022 and 1024, respectively. The shorting switches 1032 and 1034 couple the differential input to a node 1036, and the node 1036 may be the common mode $V_{cm}$ voltage.

The sense nodes 1016 may be measured and used to determine mismatch between an external common mode $V_{cm,p}$ and an internal common mode $V_{cm,i}$. The external common mode $V_{cm,p}$ may be monitored by controlling the switches 1012 and 1014 to enter conducting mode to allow the sense node 1016 to equilibriate to an average voltage between the differential input nodes 1002 and 1004 external to the ADC 1000. A digital-to-analog converter (DAC) 1042 may measure the external common mode $V_{cm,p}$ values. The ADC 1042 may generate a common mode value $D_{cm}$ based on the $V_{cm,i}$ and $V_{cm,p}$ values. That common mode value $D_{cm}$ may be provided to a controller 1044. Mismatch between the $V_{cm,i}$ and $V_{cm,p}$ values create a differential signal that may appear at an output of the circuit 1000 or create noise in the output of the circuit 1000, such that the output of the circuit 1000 may be improved by detecting the mismatch and compensating for the mismatch.

Compensation may be obtained through the feedback path 1060. The compensation may be provided through auxiliary DAC 1062 according to a digital code selected by the controller 1044 according to monitoring of the $D_{cm}$ and $D_{main}$ outputs. The differential input signal may be processed through ADC components 1050, such as through sampling capacitors 1022 and 1024, a comparator 1052, other loop filter components 1054, and a quantizer 1056 to generate a quantized output $D_{main}$. The quantized output $D_{main}$ may be provided to the controller 1044 and used by the controller 1044 to generate a digital output $D_{out}$ of the circuit 1000. The controller 1044 may also use the quantized output $D_{main}$ to generate control signals for controlling the feedback path 1060. The feedback path 1060 may include an auxiliary DAC 1062. The feedback path 1060 may also include main DAC 1064, which receives the quantized output $D_{main}$ and feeds the $D_{main}$ value back to the ADC 1000. The controller 1044 may generate control signals for operating the auxiliary DAC 1062, which applies a signal to the internal CM sense nodes to compensate for CM mismatch.

The controller 1044 may be configured to process the microphone interface configuration. The interface configuration may be determined, in part, from the quantizer 1056 output. The quantizer 1056 digital output code represents the differential-mode (DM) representation of the inputs. That is, after filtering quantization noise, the quantized output $D_{main}$ has $V_{ip}$–$V_{in}$ information, where $V_{ip}$ is an input at node 1002 and $V_{in}$ is an input at node 1004. The interface configuration may also be determined, in part, from the ADC 1042 output, which includes information from sense nodes 1016. By digitizing the sense node 1016 voltages, the controller 1044 may have the common-mode (CM) information, e.g. an indication of the value $(V_{ip}+V_{in})/2$, regarding the differential input voltages at input nodes 1002 and 1004. Using this DM and CM information, the controller 1044 may determine the interface configuration (e.g., either fully-differential FD or pseudo-differential PD), and the controller 1044 may also determine possible DM or CM mismatch of the differential input signals at input nodes 1002 and 1004.

The controller 1044 may determine the microphone is in pseudo-differential (PD) configuration when the DM output is at a mid-code centered output code and the CM data indicates an AC signal term appears at the sense node. If a pseudo-differential (PD) configuration is not detected, then the controller 1044 may determine that the microphone is operating in a fully-differential (FD) configuration. The controller 1044 may determine an AC mismatch is present when the CM data includes an AC signal term and the DM data has no code shift. The controller 1044 may determine a DC mismatch when the CM data does not indicate an AC signal term and the DM data has a code shift. The controller 1044 may determine an AC and DC mismatch is present when the CM data indicates an AC signal term and the DM data has a code shift. In any of these scenarios, the AC signal term on the CM input may be proportional to the input AC mismatch amplitude, and the code shift on the DM input may be proportional to the DC mismatch.

Figure 11:
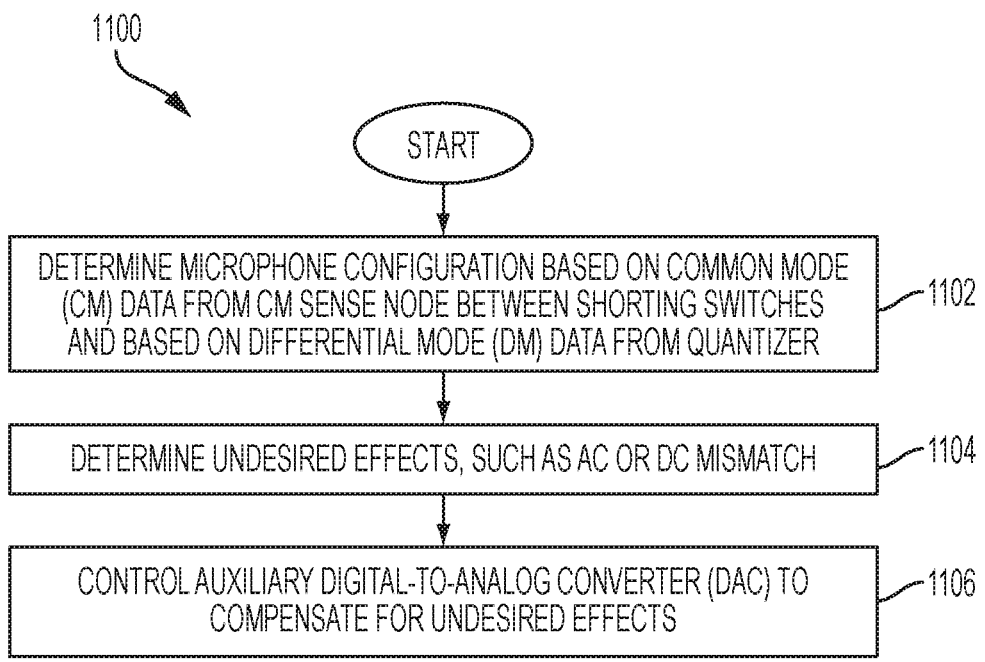
FIG. 11 is a flow chart illustrating an example method for determining microphone configuration and applying mismatch compensation according to one embodiment of the disclosure.

One method for operation of the controller 1044 is shown in FIG. 11. FIG. 11 is a flow chart illustrating an example method for determining microphone configuration and applying mismatch compensation according to one embodiment of the disclosure. A method 1100 begins at block 1102 with determining a microphone configuration based on common mode (CM) data and differential mode (DM) data. The CM data may be received as a signal indicative of a voltage level at a CM sense node, such as in the signal $D_{cm}$ from ADC 1042 in FIG. 10. The DM data may be received as a signal from a quantizer in the differential mode path, such as the signal $D_{main}$ from the quantizer 1056 in FIG. 10. Then, the method 1100 continues to block 1104, to determine undesired effects within the ADC from the microphone input. For example, block 1104 may include determining the presence of an AC or DC mismatch between the differential input nodes and/or the between the internal and the external common mode. Next, at block 1106, the method 1100 may include controlling components of the ADC, such as an auxiliary DAC, to compensate for the undesired effects of block 1104. For example, the auxiliary DAC 1062 may be controlled to apply a signal to the differential input of the ADC to compensate for mismatches.

The compensation of block 1106 may be applied to, for example, cancel a mismatched portion of input transferred charge. The total ADC input path charge for the differential inputs may be given by $q_{i,p}$ and $q_{i,n}$ as shown below:

$$q_{i,p} = C_i \left\{ V_{DMi} + \frac{\Delta V_{CMi} + \Delta V_{DMi}}{2} \right\}$$

$$q_{i,n} = C_i \left\{ -V_{DMi} - \frac{\Delta V_{CMi} + \Delta V_{DMi}}{2} \right\}$$

The DAC path charges of the differential inputs may be given by $q_{dac,p}$ and $q_{dac,n}$ as shown below:

$$q_{dac,p} = C_{dac,main} \cdot V_{refn,main}(D_{main}) + C_{dac,aux} \cdot V_{refn,aux}(D_{aux})$$

$$q_{dac,n} = C_{dac,main} \cdot V_{refp,main}(D_{main}) + C_{dac,aux} \cdot V_{refp,aux}(D_{aux})$$

An auxiliary DAC may be controlled to cancel the mismatched portion of the input transferred charge $$\left( \frac{\Delta V_{CMi} + \Delta V_{DMi}}{2} \right).$$

In one embodiment, the controller 1044 may generate a digital code value $D_{aux}$ for output to the auxiliary DAC 1062 that causes the auxiliary DAC 1062 to apply sufficient charge to cancel the mismatched portion of the input transferred charge.

In some embodiments, the controller 1044 may take specific actions as part of the compensation step at block 1106. In the following examples, $V_{CM}$ refers to an external common mode, and $V_{cm,i}$ and $V_{cm,p}$ refer to the common mode at the inputs $V_{in}$ and $V_{ip}$, respectively. For example, when $D_{cm}$ has only a DC term (that may be proportional to $V_{cm,i}-V_{cm}$) and $D_{main}$ does not have a DC shift, the controller 1044 may determine the interface is fully differential (FD) with matched DC and AC values, and thus the generated $D_{aux}$ output may be neutral (such as set at a mid-code). As another example, when $D_{cm}$ has only a DC term (that may be proportional to $V_{cm,i}-V_{cm}+\Delta V_{cm,i}/2$) and $D_{main}$ has a DC shift (that may be proportional to $\Delta V_{cm,i}$), the controller 1044 may determine the interface is fully differential (FD) and the input DC values are mismatched, and thus the generated $D_{aux}$ output may be selected to compensate the undesired charge proportional to $\Delta V_{cm,i}/2$. As another example, when $D_{cm}$ has a DC term (that may be proportional to $V_{cm,i}-V_{cm}$) and an AC term (that may be proportional to $\Delta V_{dm,i}$) and $D_{main}$ does not have a DC shift, the controller 1044 may determine the interface is fully differential (FD) with matched DC input values but mismatched AC values, and thus the generated $D_{aux}$ output may be selected to compensate for the undesired charge proportional to $\Delta V_{dm,i}/2$. As a further example, when $D_{cm}$ has a DC term (that may be proportional to $V_{cm,i}-V_{cm}+\Delta V_{cm,i}/2$) and an AC term (that may be proportional to $\Delta V_{dm,i}$) and $D_{main}$ has a DC shift, the controller 1044 may determine the interface is fully differential (FD) with mismatched AC and DC values, and thus the generated $D_{aux}$ output may be selected to compensate the undesired charge proportional to $(\Delta V_{cm,i}+\Delta V_{dm,i})/2$. As another example, when $D_{cm}$ has a DC term (that may be proportional to $V_{cm,i}/2-V_{cm}$) and an AC term (that may be proportional to $V_{dm,i}/2$), $D_{main}$ has no DC shift, $D_{cm}$ has a high DC term, and $D_{cm}$ has a high (e.g., $>=V_{dm,i}/2$) AC term, the controller 1044 may determine the interface is pseudo differential (PD), and thus the generated $D_{aux}$ output may be selected to compensate the undesired charge proportional to $V_{cm,i}/2$ to remove the DC shift on active block outputs.

Figure 12:
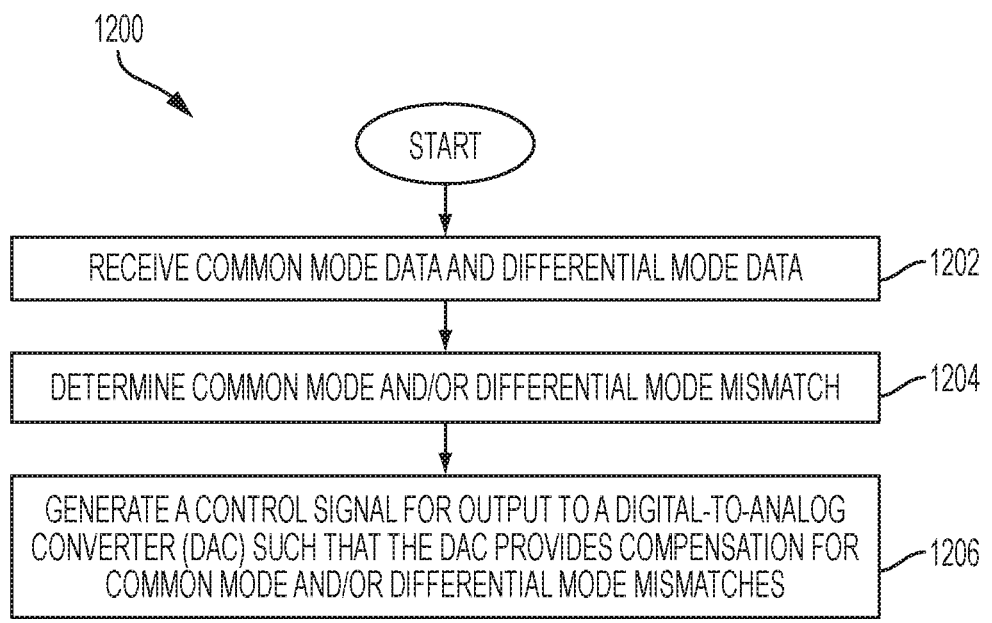
FIG. 12 is a flow chart illustrating an example method for compensating undesired effects in an analog-to-digital converter (ADC) according to one embodiment of the disclosure.

One example embodiment of determining undesired effects and applying compensation is described in more detail with reference to FIG. 12. FIG. 12 is a flow chart illustrating an example method for compensating undesired effects in an analog-to-digital converter (ADC) according to one embodiment of the disclosure. A method 1200 may begin at block 1202 with receiving common mode (CM) data and differential mode (DM) data. The received CM data and DM data may be, for example, an average of the differential input node voltages and a difference of the differential input node voltages, respectively. Then, at block 1204, undesired effects, such as common mode (CM) and/or differential mode (DM) mismatches may be determined. The CM mismatch and DM mismatch may be two unknowns calculated based, in part, on the received CM data and DM data from block 1202. Next, at block 1206, a control signal may be generated for output to a digital-to-analog converter (DAC), in which the control signal is selected such that the DAC provides compensation for at least some of the undesired effects determined at block 1204. For example, the DAC may be controlled to neutralize DC mismatch between the differential inputs.

Figure 13:
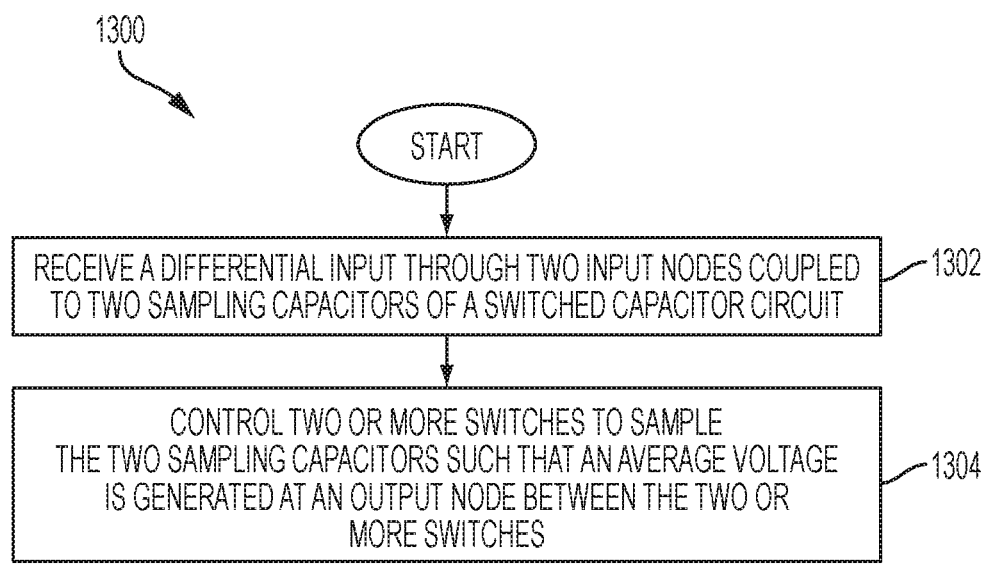
FIG. 13 is a flow chart illustrating an example method for sensing common mode (CM) data in an analog-to-digital converter (ADC) according to one embodiment of the disclosure.

The CM data received at block 1202 may be received from a CM sense node within an ADC, such as the CM sense node 1016 of FIG. 10. One example method for obtaining the CM data is described in more detail with reference to FIG. 13. FIG. 13 is a flow chart illustrating an example method for sensing common mode (CM) data in an analog-to-digital converter (ADC) according to one embodiment of the disclosure. A method 1300 may begin at block 1302 with receiving a differential input through two input nodes coupled to two sampling capacitors of a switched capacitor circuit. For example, a differential input may be received at input nodes 1002 and 1004 coupled to sampling capacitors 1022 and 1024 of FIG. 10. Then, at block 1304, two or more switches may be controlled to sample the two sampling capacitors such that an average voltage is generated at an output node between the two or more switches. For example, switches 1012 and 1014 may be controlled to switch to a conducting state to sample an average voltage of sampling capacitors 1022 and 1024.

The schematic flow chart diagrams of FIG. 2, FIG. 4, FIG. 11, FIG. 12, and FIG. 13 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random access memory (DRAM), electronically programmable read-only memory (EPROM), or other memory devices. The logic circuitry may be configured through hard-wire connections or through programming by instructions contained in firmware. Further, the logic circuitry may be configured as a general purpose processor capable of executing instructions contained in software. If implemented in firmware and/or software, functions described above may be stored as one or more instructions or code on a computer-readable medium or in the memory circuitry. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although analog-to-digital converters (ADCs) are described throughout the detailed description, aspects of the invention may be applied to the design of other converters, such as digital-to-analog converters (DACs) and digital-to-digital converters, or other circuitry and components based on delta-sigma modulation. As another example, although microphone interfaces for analog-to-digital converters (ADCs) are described herein, the ADCs disclosed herein may be applied to any analog input device. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for compensating common mode and differential mode mismatches for an analog-to-digital converter (ADC), comprising:
   receiving digital common mode (CM) data and differential mode (DM) data; and
   generating a control signal for output to a digital-to-analog converter (DAC) such that the digital-to-analog converter (DAC) provides compensation in the analog-to-digital converter (ADC) for least one of common mode and differential mode mismatches based, at least in part, on the received digital common mode (CM) data and differential mode (DM) data.

2. The method of claim 1, wherein the step of receiving the common mode (CM) data comprises receiving a DC average voltage level between differential input nodes of the analog-to-digital converter (ADC), wherein the DC average voltage level is received from a common mode (CM) sense node coupled to the differential input nodes by switches.

3. The method of claim 2, further comprising the step of activating the switches to sample sampling capacitors coupled to the differential input nodes, wherein the switches are activated to obtain the DC average voltage level.

4. The method of claim 1, wherein the step of receiving the differential mode (DM) data comprises receiving a difference between differential input nodes, wherein the difference is received from a quantizer of the analog-to-digital converter (ADC).

5. The method of claim 1, wherein the step of generating the control signal comprises the steps of:
   determining a configuration of a microphone coupled to differential input nodes of the analog-to-digital converter (ADC); and
   determining common mode and differential mode mismatches in the analog-to-digital converter (ADC),
   wherein the step of generating the control signal comprises generating the control signal based, at least in part, on the determined configuration of the microphone and the determined common mode and differential mode mismatches.

6. The method of claim 1, wherein the analog-to-digital converter (ADC) comprises a switched-capacitor ADC.

7. The method of claim 1, wherein the analog-to-digital converter (ADC) comprises a continuous-time ADC.

8. An apparatus, comprising:
   a controller configured to operate an analog-to-digital converter (ADC) by performing steps comprising:
      receiving digital common mode (CM) data and differential mode (DM) data; and
      generating a control signal for output to a digital-to-analog converter (DAC) such that the digital-to-analog converter (DAC) provides compensation in the analog-to-digital converter (ADC) for a mismatch of at least one of common mode and differential mode based, at least in part, on the received digital common mode (CM) data and differential mode (DM) data.

9. The apparatus of claim 8, wherein the step of receiving the common mode (CM) data comprises receiving a DC average voltage level between differential input nodes, wherein the DC average voltage level is received from a common mode (CM) sense node coupled to the differential input nodes by switches.

10. The apparatus of claim 9, wherein the controller is further configured to perform the step of activating the switches to sample sampling capacitors coupled to the differential input nodes, wherein the switches are activated to obtain the DC average voltage level.

11. The apparatus of claim 8, wherein the step of receiving the differential mode (DM) data comprises receiving a difference between differential input nodes, wherein the different is received from a quantizer of the analog-to-digital converter (ADC).

12. The apparatus of claim 8, wherein the step of generating the control signal comprises the steps of:
   determining a configuration of a microphone coupled to differential input nodes of the analog-to-digital converter (ADC); and
   determining undesired effects in the analog-to-digital converter (ADC),
   wherein the step of generating the control signal comprises generating the control signal based, at least in part, on the configuration of the microphone and the undesired effects.

13. The apparatus of claim 8, wherein the controller is configured to control a switched capacitor analog-to-digital converter (ADC).

14. The apparatus of claim 8, wherein the controller is configured to control a continuous-time analog-to-digital converter (ADC).

15. A method for sensing an average of differential input voltages at two input nodes in a common-mode insensitive switched-capacitor system, comprising:
   providing differential inputs to the switched-capacitor system, wherein at least two sampling capacitors are coupled to each of the two input nodes; and
   operating two or more switches to sample the at least two sampling capacitors such that an average voltage of the differential inputs is generated at an output node.

16. The method of claim 15, further comprising converting an analog value of the average voltage to a digital value for feedback to a controller of the switched-capacitor system.

17. The method of claim 15, further comprising compensating for undesired effects at the differential inputs based, at least in part, on the average voltage generated at the output node.

18. An apparatus, comprising:
   a differential input comprising a first input node and a second input node;
   at least two sampling capacitors comprising a first capacitor coupled to the first input node and a second capacitor coupled to the second input node;
   at least two switches comprising a first switch coupled to the first capacitor and a second switch coupled to the second capacitor and coupled to the first switch; and
   a controller coupled to the at least two switches, wherein the controller is configured to perform steps comprising operating the at least two switches to sample the at least two sampling capacitors such that an average voltage of the differential inputs is generated at an output node between the first switch and the second switch.

19. The apparatus of claim 18, further comprising an analog-to-digital converter (ADC) coupled to the output node and coupled to the controller, wherein the ADC is configured to provide common mode (CM) data to the controller based on the average voltage.

20. The apparatus of claim 18, further comprising a digital-to-analog converter (DAC), wherein the controller is further configured to operate the DAC to compensate for mismatch at the differential input based, at least in part, on the average voltage generated at the output node.

* * * * *